(12) United States Patent
Hu et al.

(10) Patent No.: US 10,615,151 B2
(45) Date of Patent: Apr. 7, 2020

(54) INTEGRATED CIRCUIT MULTICHIP STACKED PACKAGING STRUCTURE AND METHOD

(71) Applicant: SHENZHEN XIUYUAN ELECTRONIC TECHNOLOGY CO., LTD, Shenzhen (CN)

(72) Inventors: Chuan Hu, Chandler, AZ (US); Junjun Liu, Albany, NY (US); Yuejin Guo, Phoenix, AZ (US); Edward Rudolph Prack, Phoenix, AZ (US)

(73) Assignee: SHENZHEN XIUYUAN ELECTRONIC TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 16/465,229

(22) PCT Filed: Nov. 30, 2016

(86) PCT No.: PCT/CN2016/107831
§ 371 (c)(1),
(2) Date: May 30, 2019

(87) PCT Pub. No.: WO2018/098647
PCT Pub. Date: Jun. 7, 2018

(65) Prior Publication Data
US 2019/0326261 A1 Oct. 24, 2019

(51) Int. Cl.
*H01L 25/065* (2006.01)
*H01L 21/48* (2006.01)
(Continued)

(52) U.S. Cl.
CPC ........ *H01L 25/0657* (2013.01); *H01L 21/486* (2013.01); *H01L 23/3107* (2013.01);
(Continued)

(58) Field of Classification Search
None
See application file for complete search history.

(56) References Cited

U.S. PATENT DOCUMENTS 5,870,289 A * 2/1999 Tokuda ............... H01L 21/6835
361/779
6,051,093 A * 4/2000 Tsukahara ............. H01L 21/563
156/251
(Continued)

FOREIGN PATENT DOCUMENTS

CN 1484308 3/2004
JP 2000223649 8/2000

OTHER PUBLICATIONS

International Search Report issued in application No. PCT/CN2016/107831 dated Aug. 2, 2017.

*Primary Examiner* — J. E. Schoenholtz
(74) *Attorney, Agent, or Firm* — Hogan Lovells US LLP

(57) ABSTRACT

An integrated circuit multichip stacked packaging structure and method, including: first pins, provided at bottom surface of first chip; second pins, provided at top surface of second chip; circuit layers, provided at top surface of substrate, and/or circuit layers, provided at bottom surface of substrate, and/or circuit layers, provided within substrate; first chip, provided at top surface of substrate; second chip, provided at top surface of first chip; first pin is electrically connected at least to one of circuit layers provided with circuit pins, substrate is provided with connecting through hole, which is docked with circuit pin, first opening thereof is docked with first pin, second opening thereof is operating window, electrically-conductive layer is provided within connecting through hole, and electrically connects first pin to circuit pin; second pin is electrically connected at least to one of circuit layers; second pin is electrically connected to circuit layer via electrically-conductive layer.

20 Claims, 7 Drawing Sheets

(51) Int. Cl.
*H01L 23/31* (2006.01)
*H01L 23/498* (2006.01)
*H01L 23/00* (2006.01)
*H01L 25/10* (2006.01)
*H01L 25/00* (2006.01)

(52) U.S. Cl.
CPC ...... *H01L 23/3121* (2013.01); *H01L 23/3135* (2013.01); *H01L 23/4985* (2013.01); *H01L 23/49827* (2013.01); *H01L 23/49833* (2013.01); *H01L 23/49838* (2013.01); *H01L 24/08* (2013.01); *H01L 24/32* (2013.01); *H01L 24/48* (2013.01); *H01L 24/83* (2013.01); *H01L 24/85* (2013.01); *H01L 25/105* (2013.01); *H01L 25/50* (2013.01); *H01L 2224/08235* (2013.01); *H01L 2224/32235* (2013.01); *H01L 2224/48091* (2013.01); *H01L 2224/48106* (2013.01); *H01L 2224/48227* (2013.01); *H01L 2225/0651* (2013.01); *H01L 2225/06548* (2013.01); *H01L 2225/06562* (2013.01); *H01L 2225/06565* (2013.01); *H01L 2225/06582* (2013.01); *H01L 2225/06589* (2013.01); *H01L 2225/107* (2013.01); *H01L 2225/1023* (2013.01)

(56) References Cited

U.S. PATENT DOCUMENTS

| | | | |
|---|---|---|---|
| 6,175,158 B1 | 1/2001 | Degani et al. | |
| 6,497,943 B1* | 12/2002 | Jimarez | B32B 15/08 428/209 |
| 6,621,172 B2* | 9/2003 | Nakayama | H01L 21/563 257/686 |
| 7,960,827 B1* | 6/2011 | Miller, Jr. | H01L 23/3677 257/712 |
| 9,953,907 B2* | 4/2018 | Chang | H01L 23/49816 |
| 10,115,704 B2* | 10/2018 | Sagiya | H01L 23/5389 |
| 10,186,480 B2* | 1/2019 | Muthukumar | H01L 23/3121 |
| 2002/0004258 A1* | 1/2002 | Nakayama | H01L 21/563 438/107 |
| 2007/0096266 A1* | 5/2007 | Yu | G11C 5/02 257/666 |
| 2007/0096334 A1* | 5/2007 | Kawabata | H01L 25/0652 257/777 |
| 2007/0158820 A1* | 7/2007 | Pendse | H01L 21/563 257/700 |
| 2008/0169557 A1* | 7/2008 | Tsao | H01L 21/563 257/723 |
| 2013/0049179 A1* | 2/2013 | Desai | H01L 23/3128 257/666 |
| 2014/0357021 A1* | 12/2014 | Haba | H01L 25/0652 438/109 |
| 2016/0293575 A1* | 10/2016 | Liu | H01L 25/0652 |
| 2017/0243858 A1* | 8/2017 | Chou | H01L 25/0657 |

* cited by examiner

INTEGRATED CIRCUIT MULTICHIP STACKED PACKAGING STRUCTURE AND METHOD

TECHNICAL FIELD

The present disclosure belongs to the electronic field, and in particular relates to integrated circuit multichip stacked packaging structure and method.

BACKGROUND ART

Conventional integrated circuit multichip stacked packaging methods often use the method of wire bonding to connect the circuits on each chip to the circuits on the substrate. Due to the large amount of space occupied by the wire leads, the resulting integrated circuit package is bulky overall. Moreover, the wire leads need to be kept from making contact with each other, which further reduces the number of wire leads that can be wired; and the space utilization rate is low, resulting in a small number of connection lines between the chip and the peripheral circuits, which limits the density and total amount of data communication ports and limits the expansion of circuit functions. Moreover, the wire bonding is sequential bonding of each wire lead, the packaging efficiency is low, and an expensive gold wire or a copper wire with a complicated composition is also required to use, thereby the cost of manufacturing is high.

SUMMARY

Based on the above, the present disclosure overcomes defects of the prior art, and provides a integrated circuit multichip stacked package (packaging) structure and method, wherein the chip and the circuit layer are connected with high density, small volume, and low production cost.

Its technical solutions are as follows:

An integrated circuit multichip stacked package structure, comprising: a first chip, the bottom surface of the first chip is provided with a first pin; a second chip, the top surface of the second chip is provided with a second pin; a substrate, the top surface of the substrate is provided with a circuit layer, or/and a bottom surface of the substrate is provided with a circuit layer, or/and a circuit layer is provided in the substrate; wherein the first chip is provided on the top surface of the substrate. The second chip is provided on the top surface of the first chip; the first pin is electrically connected to at least one of the circuit layers: the circuit layer is provided with a circuit pin, and the substrate is provided with a connection through hole, the connection through hole abutting the circuit pin, a first opening of the connection through hole abutting the first pin, and a second opening of the connection through hole is an operation window, a conductive layer is provided in the connection through hole, the conductive layer electrically connecting the first pin and the circuit pin; the second pin is electrically connected to at least one of the circuit layers: the second pin and the circuit layer are electrically connected by a conductive wire lead.

In one of the embodiments, the second chips are at least two, at least two second chips are in stacked arrangement, and in the two adjacent second chips, the second chip at the top layer is mounted on the top surface of the second chip at bottom layer, and the second chip at the top layer is offset from the second pin on the second chip at the bottom layer.

In one of the embodiments, the top surface of the second chip at the topmost layer is provided with a heat sink.

In one of the embodiments, an adhesive film is provided between the first chip and the substrate, the adhesive film bonds the first chip to the substrate, and the adhesive film is provided with an additional through hole. The additional through hole is connected with the first opening of the connection through hole, and the conductive layer extends into the additional through hole and is electrically connected to the first pin.

In one of the embodiments, the integrated circuit multichip stacked package structure further includes an encapsulation layer. The first chip and the second chip are located between the encapsulation layer and an associated substrate. And the encapsulation layer packages the first chip and the second chip on the top surface of the substrate.

In one of the embodiments, the top surface of the substrate is further provided with a reinforcing strip, the reinforcing strip surrounds or partially surrounds the periphery of the chip.

In one of the embodiments, the top surface of the substrate is further provided with an encapsulation layer, the encapsulation layer comprises a filling layer and an outer casing layer. The filling layer, the reinforcing strip, the first chip, and the second chip are located between the outer casing layer and the substrate, and one end of the reinforcing strip abuts against the substrate. The other end abuts against the outer casing layer, and the filling layer is filled between the outer casing layer and the substrate.

In one of the embodiments, the substrate comprises at least two substrate sheets. At least two substrate sheets are in stacked arrangement, the substrate sheet is provided with the circuit layers, at least one of the substrate sheets is provided with a through hole, and a conductive material passes through the through hole to electrically connect at least two circuit layers.

In one of the embodiments, the substrate, the encapsulation layer, the first chip and the second chip constitute a package subsystem. And the two package subsystems are in stacked arrangement. And the substrate of the package subsystem at the top layer is provided on the top surface of the encapsulation layer of the package subsystem at the bottom layer. The encapsulation layer of the package subsystem at the bottom layer is provided with a via hole. A conductor is provided in the via hole, and the conductor in the via hole and the conductive layer in the connection through hole of the package subsystem at the top layer are electrically connected. And the conductor within the via hole is electrically connected to the circuit layers of the package subsystem at the bottom layer.

In one of the embodiments, the substrate is provided with at least two layers of the circuit layer, the top surface of the substrate is provided with the circuit layer, or/and the bottom surface of the substrate is provided with a circuit layer, or/and a circuit layer is provided in the substrate. And the first pins are at least two; and one of the first pins is electrically connected to at least one of the circuit layers. The other one of the first pins is electrically connected to at least the other one of the remaining circuit layers.

In one of the embodiments, the substrate is a flexible circuit board, or the substrate comprises at least two layers of flexible circuit boards, which are in stacked arrangement.

An integrated circuit multichip stacked package method includes: a first pin is provided on a bottom surface of the first chip, a second pin is provided on a top surface of the second chip, and the second chip is provided on a top surface of the first chip; a top surface of the substrate is provided with a circuit layer, or/and a bottom surface of the substrate is provided with a circuit layer, or/and a circuit layer is provided in the substrate, and the circuit layer is provided with a circuit pin. The substrate is provided with a connection through hole, the circuit pin is engaged with the connection through hole; the first pin is electrically connected to at least one of the circuit layers, and the first chip is placed on the substrate, a bottom surface of the first chip faces the substrate, a first opening of the connection through hole is engaged with the first pin, and a conductive layer is formed in the connection through hole through a second opening of the connection through hole, the conductive layer electrically connects the first pin and the circuit pin; the second pin is electrically connected to at least one of the circuit layers, the second pin and the circuit layers are electrically connected through a conductive wire lead.

An integrated circuit multichip stacked package method includes: a first pin is provided on a bottom surface of the first chip, a second pin is provided on a top surface of the second chip, and the second chip is provided on a top surface of the first chip; the first chip is placed on the substrate, a bottom surface of the first chip faces the substrate, a top surface of the substrate is provided with a circuit layer, or/and a bottom surface of the substrate is provided with a circuit layer, or/and a circuit layer is provided in the substrate, the circuit layer is provided with a circuit pin; the first pin is electrically connected to at least one of the circuit layers, and a connection through hole is made on the substrate, so that the first opening of the connection through hole is engaged with the first pin. And the circuit pin is engaged with the connection through hole, and a conductive layer is formed in the connection through hole through the second opening of the connection through hole, so that the conductive layer electrically connects the first pin and the circuit pin; the second pin is electrically connected to at least one of the circuit layers, and the second pin is electrically connected to the circuit layer through a conductive wire lead.

The beneficial effects of the present disclosure are as follows:

1. The integrated circuit multichip stacked package structure includes: a first chip, a bottom surface of the first chip is provided with a first pin; a second chip, a top surface of the second chip is provided with a second pin; a substrate, the a top surface of the substrate is provided with a circuit layer, or/and a bottom surface of the substrate is provided with a circuit layer, or/and a circuit layer is provided in the substrate; wherein the first chip is provided on a top surface of the substrate, the second chip is provided on a top surface of the first chip; the first pin is electrically connected to at least one of the circuit layers, the circuit layer is provided with a circuit pin, and the substrate is provided with a connection through hole. The connection through hole is engaged with the circuit pin, the first opening of the connection through hole is engaged with the first pin, and the second opening of the connection through hole is an operation window, and a conductive layer is provided in the connection through hole, the conductive layer electrically connects the first pin and the circuit pin; the second pin is electrically connected to at least one of the circuit layers, and the second pin is electrically connected to the circuit layer through a conductive wire lead.

In the above, the first chip is provided on the top surface of the substrate, and the second chip is provided on the top surface of the first chip; the two chips are in stacked arrangement, the first pin is located on a bottom surface of the first chip, and is electrically connected to the circuit pin of the circuit layer on the substrate through the conductive layer, and the second pin is located on the top surface of the second chip, and is electrically connected to the circuit pin of the circuit layer on the substrate through the conductive wire lead. The circuit is connected through the space each below the first chip and above the second chip, and the second chip does not block the electrical connection between the first pin and the circuit pin, and the first chip also does not block the electrical connection between the second pin and the circuit pin, which provides sufficient space for the connection of the first chip and the second chip to the substrate; when the first chip is placed on the top surface of the substrate, the first pin is located between the first chip and the substrate, the connection through hole provides an operation space for fabricating the conductive layer, so that the conductive layer can be electrically connected to the circuit pin and the first pin at the same time, thereby electrically connecting the first pin and the circuit pin and realizing the electrical connection between the first chip and the circuit layer of the substrate. The first chip and the second chip are electrically connected to the circuit layer of the substrate from two directions, the top surface and the bottom surface respectively, the connection point is increased, the transmission capability is enhanced, the connection range of the chip can be expanded, and more connections are realized, and the chip is provided on the substrate as many as possible. On the other hand, the conventional electronic package uses a lead to realize electrical connection between the chip and the circuit layer of the substrate, and the lead occupies a huge space. The present disclosure realizes electrical connection between the first chip and the circuit layer by the way of opening a connection through hole on the substrate. The conductive layer is provided in the connecting through hole, does not occupy extra space, which can reduce the overall volume after packaging.

Moreover, the overall thickness of the substrate, and the first chip and the second chip is reduced, and even no gap is required to reserve between the substrate and the first chip (in principle, no gap is required to reserve, but other materials may be provided between the substrate and the first chip as needed); the production of conductive through hole may not require high temperature heating step, which is very helpful for the use of ultra-thin chip and flexible circuit board, because the method of the present disclosure can avoid the damage of various thermo-mechanical stress distributions to the mechanism and performance of ultra-thin chip and flexible circuit board during high-temperature thermal cycling.

(The "top" and "bottom" orientations refer to the orientations shown in the drawings, but only for the sake of clarity and conciseness of description, and the orientation created by the present disclosure cannot be limited thereto, and the integrated circuit multichip stacked package structure can be rotated to any angle)

2. The second chip is at least two, at least two second chips are in stacked arrangement, and in the two adjacent second chips, the second chip at the top layer is mounted on a top surface of the second chip at the bottom layer, and the second chip at the top layer is offset from the second pin on the second chip at the bottom layer. The top surface of the first chip may be provided with at least two second chips to achieve more electronic functions.

3. The top surface of the second chip of the topmost layer is provide with a heat sink. Heat dissipation is a major problem in chip stacked package. Multichip stacking increases the density of electronic functions and also increases the energy consumption per unit area without increasing the area of heat dissipation. A heat sink is provided on the top of the second chip to provide at least a top heat dissipation pathway for the heat generated by the energy consumption or operation of the chip, which helps overcome the technical bottleneck of the chip heat dissipation and avoids the high temperature affecting the working performance of the chip.

4. An adhesive film is provided between the first chip and the substrate. The adhesive film bonds the first chip to the substrate, and the adhesive film is provided with an additional through hole. The additional through hole is connected with the first opening of the connection through hole. The conductive layer extends into the additional through hole and is electrically connected to the first pin. The first chip is attached to the substrate through the adhesive film, and the first chip is fixed on the substrate during the process of placing the first chip on the substrate, which is high in efficiency, facilitates batch operation. And the adhesive film is provided with additional through holes, which does not affect the electrical connection of the conductive layer to the first pin. It may be that the adhesive film itself may be provided with an adhesive-free region in advance, which does not cover the first pin when placed, and the additional through hole is directly formed in the adhesive-free region, and the first pin is directly connected to the connection through hole and the conductive layer may be directly electrically connected to the first pin; or, after the first chip is pasted on the substrate, an additional through hole may be formed in the adhesive film.

5. The integrated circuit package structure further includes an encapsulation layer, the first chip and the second chip are located between the encapsulation layer and an associated substrate, and the encapsulation layer packages the first chip and the second chip on the top surface of the substrate. The encapsulation layer can protect the first chip and the second chip from being damaged and affected by external environmental factors. The first chip and the second chip may also be fixed on the substrate through the encapsulation layer, and the relative positions of the chip and the pin are fixed, which helps to form a stable circuit connection, and can also improve the distribution of thermo-mechanical stress by adjusting the material properties of the encapsulation layer, improving the thermo-mechanical reliability of the entire system, and the first chip and the second chip are fixed to the substrate at the same time of setting the encapsulation layer on the substrate, thereby the production efficiency is high.

6. The top surface of the substrate is further provided with a reinforcing strip, the reinforcing strip surrounds or partially surrounds the periphery of the chip. The height of the protrusion of the reinforcing strip on the substrate is equivalent to the height of the chip, and the reinforcing strip provides protection for the chip to prevent the chip from being squeezed, displaced, and bent. The first chip and the second chip form a chipset, and the chipset can be multiple. The reinforcing strip may surround or partially surround a chipset; or the reinforcing strip may surround or partially surround the more than two chipsets; or, the plurality of reinforcing strips may surround or partially surround one or more than two chipsets. This design, especially contributing to packaging ultra-thin chip or flexible circuit board, provides better mechanical protection for the overall system while maintaining the system's thinness and flexibility. The reinforcing strip may be in the form of a continuous strip or a discontinuous strip with a gap, as desired.

Further, the top surface of the substrate is further provided with an encapsulation layer, the encapsulation layer includes a filling layer and an outer casing layer, and the filling layer, the reinforcing strip, the first chip, and the second chip are located between the outer casing layer and the substrate, one end of the reinforcing strip abuts against the substrate, and the other end abuts against the outer casing layer, and the filling layer is filled between the substrate and the outer casing layer. The substrate, the reinforcing strip and the outer casing layer form a relatively stable space, and the chip is installed in this space. The outer casing layer, the reinforcing strip and the filling layer provide support for the chip, so as to protect the chip during the packaging process or during the use conditions from being squeezed, displaced, and bent.

7. The substrate comprises at least two substrate sheets, at least two of which are in stacked arrangement, the substrate sheet is provided with the circuit layer, at least one of the substrate sheets is provided with a through hole, and a conductive material passes through the through hole to electrically connect at least two circuit layers. More than two substrate sheets are in stacked arrangement, and a multilayer circuit is provided to expand the electronic functions.

8. The substrate, the encapsulation layer, the first chip and the second chip constitute a package subsystem, two package subsystems are in stacked arrangement, and the substrate of the package subsystem at top layer is provided on a top surface of the encapsulation layer of the package subsystem at the bottom layer, the encapsulation layer of the package subsystem at the bottom layer is provided with a via hole, and the via hole is provided therein with a conductor, and the conductor in the via hole is electrically connected to the conductive layer in the connection through hole of the package subsystem at the top layer. And the conductor within the via hole is electrically connected to the circuit layer of the package subsystem at the bottom layer. More than two layers of package subsystems are stacked and connected to each other, increasing the number of communication ports, increasing data transmission speed and bandwidth, and expanding circuit functions. In the package subsystem, the first chip is connected to the circuit layer of the substrate by means of connection through hole, so that the thickness of the package subsystem itself is small and the volume is small. In the same volume and thickness requirements, more layers of package subsystems can be set, which greatly expands the circuit functions.

9. The substrate is provided with at least two layers of the circuit layer, the top surface of the substrate is provided with the circuit layer, or/and the bottom surface of the substrate is provided with the circuit layer, or/and the circuit layer is provided in the substrate The first pin is at least two, and one of the first pins is electrically connected to at least one of the circuit layers. The other one of the first pins is electrically connected to at least the other one of the remaining circuit layers. The first chip is connected to more than two layers of the circuit layers at the same time. The data communication port is increased; the data transmission capability is enhanced; and the circuit function is expanded.

10. The substrate is a flexible circuit board, or the substrate includes at least two layers of flexible circuit boards, which are in stacked arrangement. The entirety itself constituted by the substrate, the encapsulation layer, the first chip and the second chip are small in thickness and volume, so that when a flexible circuit board is used, the entire system can be kept flexible, which can be bent for use in wearable systems.

11. An integrated circuit multichip stacked package method includes: a first pin is provided on a bottom surface of the first chip, a second pin is provided on a top surface of the second chip, and the second chip is provided on a top surface of the first chip; a top surface of the substrate is provided with a circuit layer, or/and a bottom surface of the substrate is provided with a circuit layer, or/and a circuit layer is provided in the substrate, and the circuit layer is provided with a circuit pin. The substrate is provided with a connection through hole, the circuit pin is engaged with the connection through hole; the first pin is electrically connected to at least one of the circuit layers, and the first chip is placed on the substrate, a bottom surface of the first chip faces the substrate, a first opening of the connection through hole is engaged with the first pin, and a conductive layer is formed in the connection through hole through a second opening of the connection through hole, the conductive layer electrically connects the first pin and the circuit pin; the second pin is electrically connected to at least one of the circuit layers, the second pin and the circuit layers are electrically connected through the conductive wire lead.

A connection through hole is formed in advance on the substrate, and after the first chip is placed on the substrate, a conductive layer is formed. In the above, the first pin is engaged with the first opening of the connection through hole, and is not necessarily strictly aligned, as long as the first pin can be electrically connected to the conductive layer through the connection through hole.

12. An integrated circuit multichip stacked package method includes: a first pin is provided on a bottom surface of the first chip, a second pin is provided on a top surface of the second chip, and the second chip is provided on a top surface of the first chip; the first chip is placed on the substrate, a bottom surface of the first chip faces the substrate, a top surface of the substrate is provided with a circuit layer, or/and a bottom surface of the substrate is provided with a circuit layer, or/and a circuit layer is provided in the substrate, the circuit layer is provided with a circuit pin; the first pin is electrically connected to at least one of the circuit layers, and a connection through hole is formed on the substrate, so that the first opening of the connection through holes is engaged with the first pin. And the circuit pin is engaged with the connection through hole, and a conductive layer is formed in the connection through hole through the second opening of the connection through hole, so that the conductive layer electrically connects the first pin and the circuit pin; the second pin of the second chip is electrically connected to at least one of the circuit layers, and the second pin is electrically connected to the circuit layer through the conductive wire lead.

DESCRIPTION OF THE REFERENCE SIGNS

Figure 1:
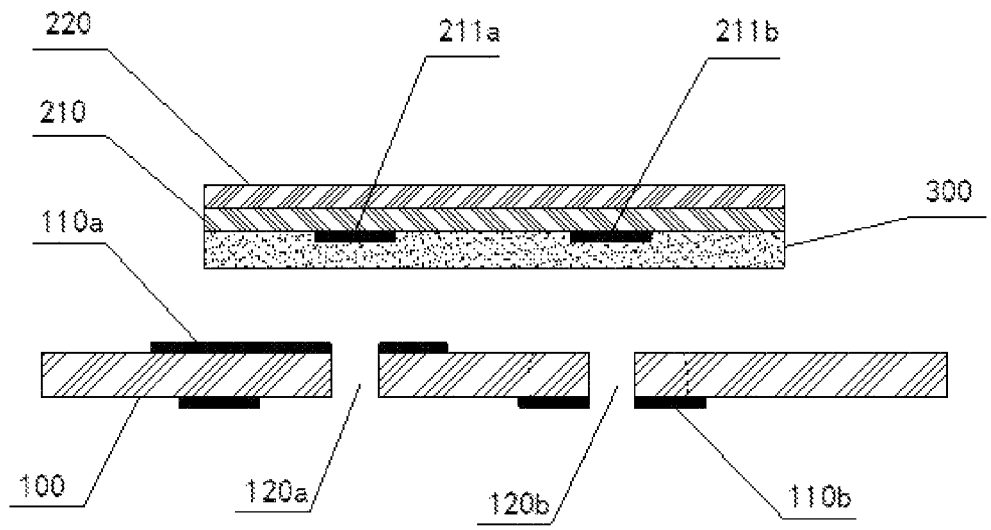
FIG. 1 is a schematic diagram 1 of an integrated circuit multichip stacked package method according to embodiment 1 of the present disclosure.

100, substrate, 101, substrate sheet, 110a, 110b, 110c, circuit layer, 120a, 120b, connection through hole, 121a, 121b, auxiliary layer, 210, first chip, 211a, 211b, first pin, 220, second chip, 300, adhesive film, 400a, 400b, conductive layer, 500a, 500b, conductive wire lead, 600, through hole, 700, heat sink, 800, encapsulation layer, 801, via hole, 810, reinforcing strip, 820, outer casing layer, 830, filling layer, 900, package subsystem.

DETAILED DESCRIPTION OF EMBODIMENTS

The present disclosure will be further described in detail below, but embodiments of the present disclosure are not limited thereto.

Embodiment 1

As shown in FIGS. 1 to 5, the integrated circuit multichip stacked package structure includes a first chip 210, a second chip 220, and a substrate 100. The bottom surface of the first chip 210 is provided with first pins 211a, 211b. The top surface of the second chip 220 is provided with a second pin. The first pins 211a, 211b include, but are not limited to, a connection portion led out from the inside of the first chip 210, and an extension pin electrically connected to the connection portion, as long as the first pin 211a, 211b can be electrically connected to the first chip 210; The principle of the second pin and the second chip 220 is the same. The circuit layers 110a and 110b are provided with circuit pins. The circuit pins may be connection portions directly led out from the circuit layers 110a and 110b, or may be extension pins electrically connected to the connection portions, as long as the circuit pins can be electrically connected to the circuit layers 110a, 110b. The top surface and the bottom surface of the substrate 100 are respectively provided with circuit layers 110a and 110b. The first chip 210 is provided on the top surface of the substrate 100, the second chip 220 is provided on the top surface of the first chip 210, and the circuit layers 110a and 110b are provided with circuits pins, the substrate 100 is provided with connection through holes 120a, 120b, the connection through holes 120a, 120b are engaged with the circuit pins, the first openings of the connection through holes 120a, 120b are engaged with the first pins 211a, 211b, the second openings of the connection through holes 120a, 120b are operation windows, and the connection through holes 120a, 120b are provided therein with conductive layers 400a, 400b. The conductive layers 400a, 400b electrically connect the first pins 211a, 211b and the circuit pins; the second pins and the circuit layers 110a, 110b are electrically connected by conductive wire leads 500a, 500b. In this embodiment, the top surface and bottom surface of the substrate 100 are respectively provided with circuit layers 110a and 110b, but are not limited thereto. The top surface and the bottom surface of the substrate 100 or one or more than two positions in the substrates 100 may be provided with circuit layers 110a, 110b, the first pins 211a, 211b are electrically connected to at least one of the circuit layers 110a, 110b, and the second pins are electrically connected to at least one of the circuit layers 110a, 110b.

In the above, the connection through holes 120a, 120b are engaged with the first pins 211a, 211b, and the first pins 211a, 211b are at least partially located near the first openings of the connection through holes 120a, 120b or deep into the connection through holes 120a, 120b, such that the conductive layers 400a, 400b may be electrically connected to the first pins 211a, 211b, the circuit pins and the connection through holes 120a, 120b are butted, and the circuit pins are at least partially located near the first opening of the connection through holes 120a, 120b, or near the two openings, or near the inner walls of the connection through holes 120a, 120b, such that the conductive layers 400a, 400b can be electrically connected to the circuit pins.

In the above, the first chip 210 is provided on the top surface of the substrate 100, and the second chip 220 is provided on the top surface of the first chip 210. The two chips are in stacked arrangement, and the first pins 211a and 211b are located on the bottom surface of the first chip 210, and are electrically connected to the circuit pins of the circuit layers 110a, 110b on the substrate 100 through the conductive layers 400a, 400b, the second pins are located on the top surface of the second chip 220, and are electrically connected to the circuit pins through the conductive wire leads 500a, 500b, and the second chip 220 does not block the electrical connection between the first pins 211a, 211b and the circuit pins, and provides sufficient space for the connection of the first chip 210 and the substrate 100; when the first chip 210 is placed on the top surface of the substrate 100, the first pins 211a, 211b are located between the first chip 210 and the substrate 100, and the connection through holes 120a, 120b provide an operation space for forming the conductive layers 400a, 400b, so that the conductive layers 400a, 400b can simultaneously be electrically connected to the circuit pins and first pin 211a, 211b, thereby electrically connecting the first pin 211a, 211b and the circuit pins, realizing the electrical connection between the first chip 210 and the circuit layers 110a, 110b of the substrate 100. The first chip 210 and the second chip 220 are electrically connected to the circuit layers 110a and 110b of the substrate 100 from two directions, the top surface and the bottom surface, respectively, and the connection points are increased, the transmission capability is enhanced, and the connection range of the chip can be expanded to realize more connection, and as many chips as possible are provided on the substrate 100. On the other hand, the conventional electronic package uses metal lead bonding to realize electrical connection between the chip and the circuit layers 110a and 110b of the substrate 100, and the lead will occupy a huge space because they need to avoid each other. In the present disclosure, the electrical connection between the first chip 210 and the circuit layers 110a and 110b are achieved by the way of opening the connection through holes 120a and 120b on the substrate 100. The conductive layers 400a and 400b are provided in the connection through holes 120a and 120b and do not take up extra space, thereby the overall volume after packaged can be reduced, especially for ultra-thin circuit board, it can maintain good thin and light characteristics, and for flexible circuit boards, it can maintain its flexibility. Moreover, the overall thickness of the substrate 100 and the first chip 210 and the second chip 220 is reduced, and even no gap is required to reserve between the substrate 100 and the first chip 210 (in principle, no gap is required to reserve, but other materials can be provided between the substrate 100 and the first chip 210, as required); the steps of heat welding are not required, especially for the package of ultra-thin circuit layers 110a and 110b and the flexible circuit board, and the substrate 100 can be prevented from warping and reducing performance at a high temperature. The fabrication of the connection through holes 120a, 120b may not require a high temperature heating step, and is very helpful for the use of the ultra-thin chip package (the first chip 210, the second chip 220 may be an ultra-thin chip) and a flexible circuit board, because it is possible to avoid damage to the mechanism and performance of ultra-thin chips and flexible circuit boards by various thermo-mechanical stress distributions during high-temperature thermal cycling.

An adhesive film 300 is provided between the first chip 210 and the substrate 100. The adhesive film 300 bonds the first chip 210 to the substrate 100. The adhesive film 300 is provided with additional through holes, and the additional through holes are in communication with the first openings of the connecting through holes 120a and 120b, and the conductive layers 400a, 400b extend into the additional through holes and are electrically connected to the first pins 211a, 211b. The first chip 210 is adhered to the substrate 100 by the adhesive film 300, and the first chip 210 is fixed to the substrate 100 during the process of placing the first chip 210 on the substrate 100, which is high in efficiency, facilitates batch operation, and the adhesive film 300 is provided with additional through holes that do not affect the electrical connection of the conductive layers 400a, 400b with the first pins 211a, 211b. The adhesive film 300 may be provided with an adhesive-free region in advance to ensure that the first pins 211a and 211b are not covered during the bonding process, and these adhesive-free regions automatically form additional through holes. The first pins 211a and 211b are directly connected to the connection through holes 120a and 120b, and the conductive layers 400a and 400b may be directly electrically connected to the first pins 211a and 211b. Alternatively, after the first chip 210 is adhered on the substrate 100, the additional through holes are provided on the adhesive film 300.

Figure 7:
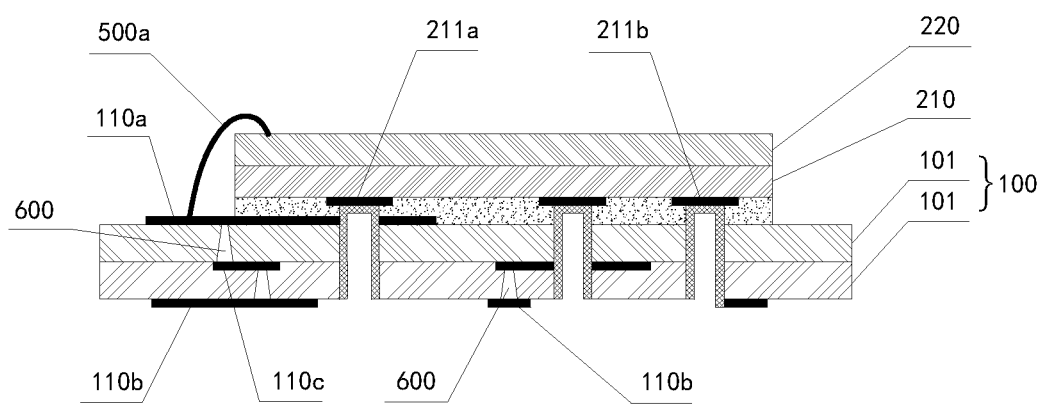
FIG. 7 is a schematic diagram 7 of an integrated circuit multichip stacked package method according to embodiment 1 of the present disclosure.
Figure 9:
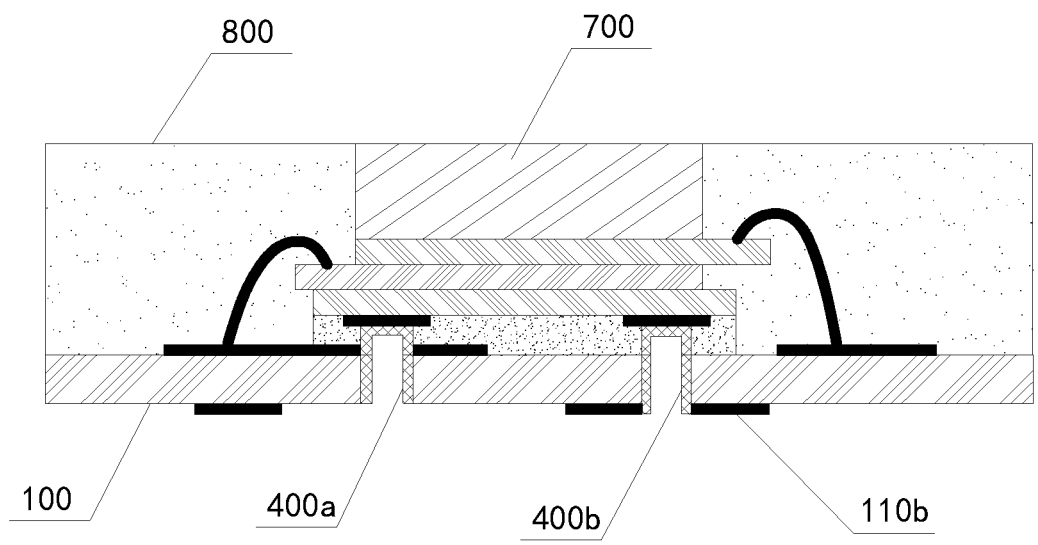
FIG. 9 is a schematic diagram 2 of an integrated circuit multichip stacked package method according to embodiment 2 of the present disclosure.

The integrated circuit multichip stacked package structure further includes an encapsulation layer 800. Referring to FIGS. 7 and 9, the first chip 210 and the second chip 220 are located between the encapsulation layer 800 and the substrate 100, and the encapsulation layer 800 packages the first chip 210 and the two chip 220 on the top surface of the substrate 100. The encapsulation layer 800 can protect the first chip 210 and the second chip 220 from the adverse effects of the external environment, such as being damaged. The first chip 210 and the second chip 220 can also be fixed on the substrate 100 through the encapsulation layer 800. When the encapsulation layer 800 is provided on the substrate 100, the first chip 210 and the second chip 220 is simultaneously fixed on the substrate 100, which has high production efficiency and ensures the stability of the circuit connection.

As required, the first chip 210 and the second chip 220 may be fixedly mounted on the substrate 100 by the encapsulation layer 800, but not limited thereto, the first chip 210 and the second chip 220 may also be fixed to the substrate 100 through the connection through holes 120*a*, 120*b* and the conductive layers 400*a*, 400*b*; or the first chip 210 and the second chip 220 are fixed to the substrate 100 by the adhesive film 300; or are fixed to the substrate 100 by other means (including but not limited to bolts, pins, buckles).

Figure 6:
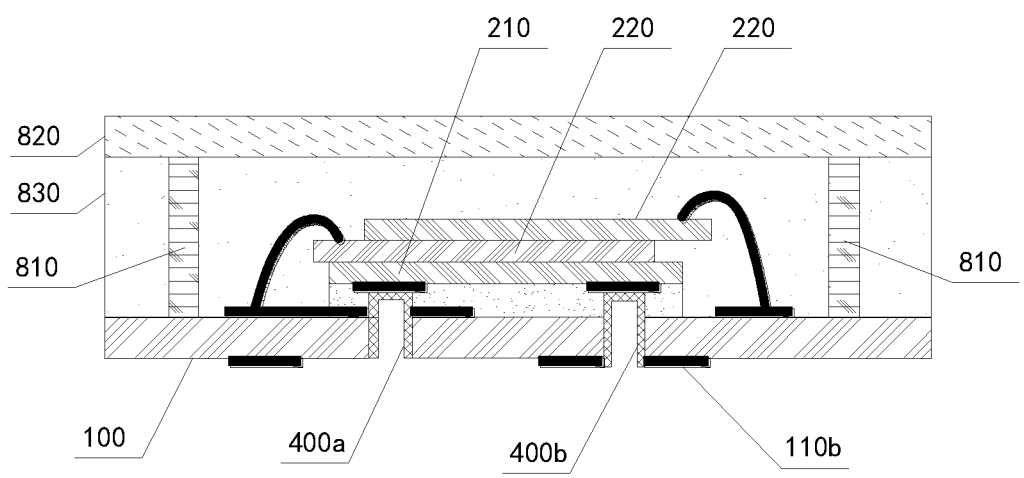
FIG. 6 is a schematic diagram 6 of an integrated circuit multichip stacked package method according to embodiment 1 of the present disclosure.

In addition, as shown in FIG. 6, the top surface of the substrate 100 is further provided with a reinforcing strip 810 and an encapsulation layer 800, and the encapsulation layer 800 packages the chip and the reinforcing strip 810 on the top surface of the substrate 100. The encapsulation layer includes a filling layer and an outer casing layer, and the first chip, the second chip, and the reinforcing strip 810 are located between the outer casing layer 820 and the substrate 100, and the reinforcing strip 810 surrounds or partially surrounds the periphery of the chip, and one end of the reinforcing strip abuts against the substrate, the other end abuts against the outer casing layer or does not abut any structure, and the filling layer is filled between the substrate and the outer casing layer. A relatively stable space is formed between the substrate 100, the reinforcing strip 810 and the outer casing layer 820. The chip is mounted in this space, and the outer casing layer provides support for the chip to avoid reducing the thermo-mechanical stress strength in the integrated circuit multichip stacked structure during the packaging manufacturing process and in the subsequent use process. The chipset composed of the first chip 210 and the second chip 220 may be provided in multiple places, and a separate reinforcing strip 810 may be matched for a separate chipset, or one reinforcing strip 810 may be matched for more than two chipsets. Especially for making packaged ultra-thin chip, or using ultra-thin circuit board or flexible circuit board, it provides more protection for chip while maintaining lightness and flexibility.

Without limitation, alternatively, as shown in FIG. 7, the substrate 100 includes at least two substrate sheets 101, at least two substrate sheets 101 are in stacked arrangement, and at least two substrate sheets 101 are provided with circuit layers 110*a*, 110*b*, 110*c*, at least one substrate sheet 101 is provided with the through holes 600, through which conductive material electrically connects at least two circuit layers 110*a*, 110*b*. More than two substrate sheets 101 are in stacked arrangement, and a multilayer circuit is provided to expand the electronic functions.

In this embodiment, the substrate 100 may be a rigid circuit board, or the substrate 100 is a flexible circuit board, or the substrate 100 includes at least two layers of flexible circuit boards, which are in stacked arrangement. The substrate 100, the encapsulation layer 800, the first chip 210, and the second chip 220 constitute small an entirety, which itself has a small thickness and a small volume, and thus, such a bendable flexibility can be maintained when a flexible circuit board is fabricated.

Figure 2:
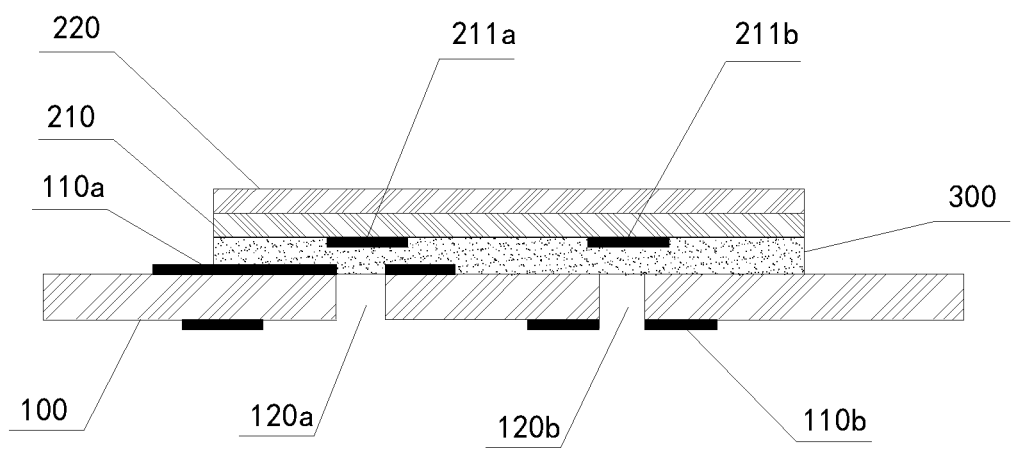
FIG. 2 is a schematic diagram 2 of an integrated circuit multichip stacked package method according to embodiment 1 of the present disclosure.
Figure 3:
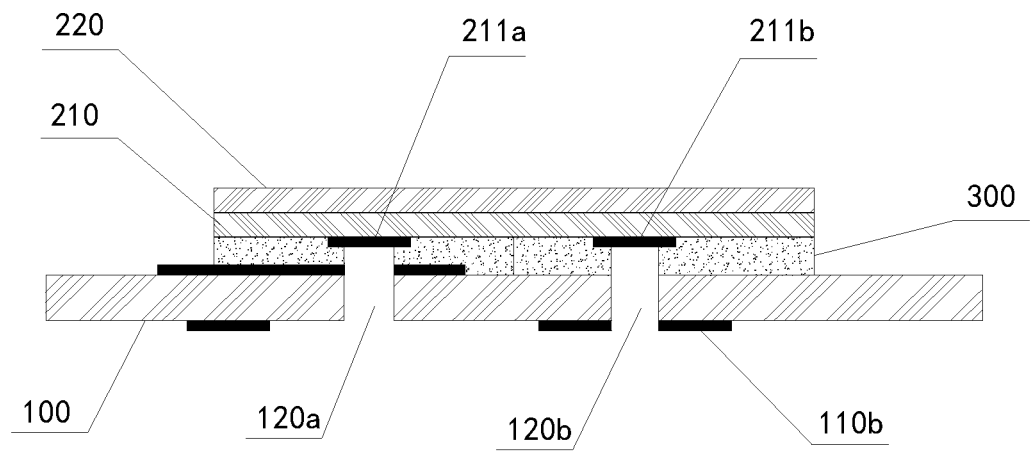
FIG. 3 is a schematic diagram 3 of an integrated circuit multichip stacked package method according to embodiment 1 of the present disclosure.
Figure 4:
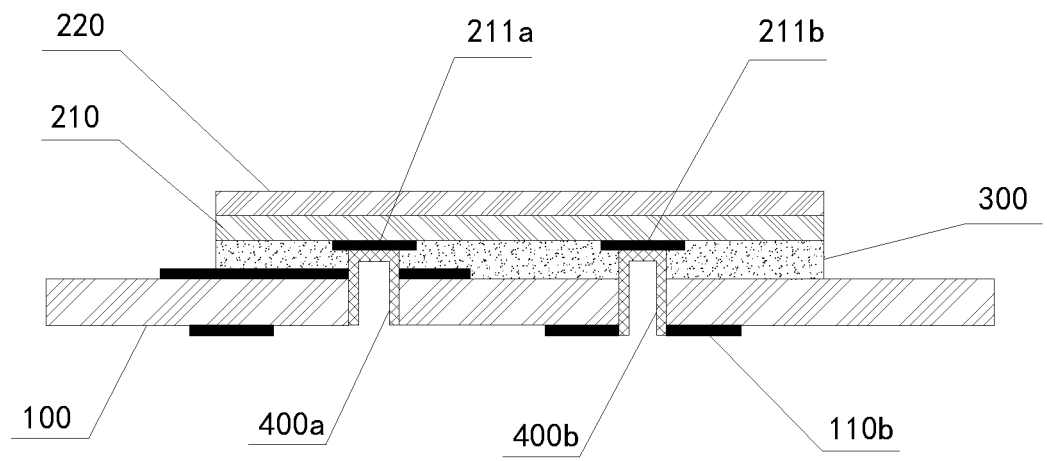
FIG. 4 is a schematic diagram 4 of an integrated circuit multichip stacked package method according to embodiment 1 of the present disclosure.
Figure 5:
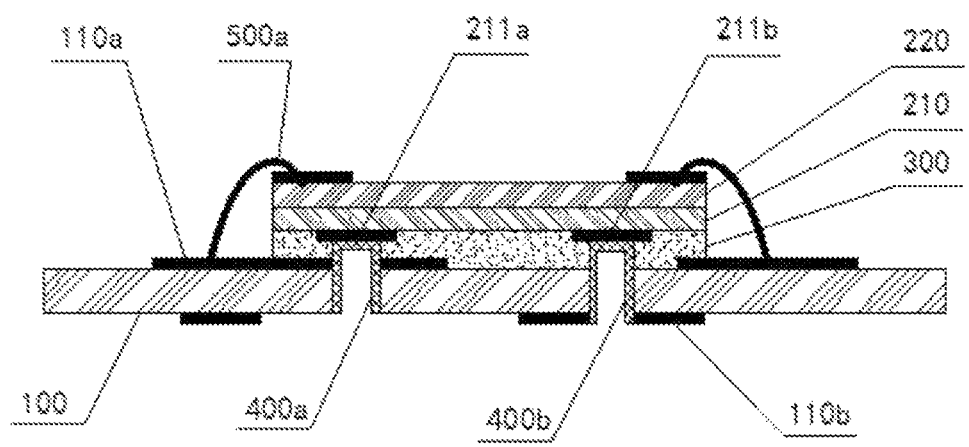
FIG. 5 is a schematic diagram 5 of an integrated circuit multichip stacked package method according to embodiment 1 of the present disclosure.

In the above, the integrated circuit multichip stacked package method comprises a pre-punch method and a post-punch method:

A. The steps of the pre-punch method includes: as shown in FIG. 1, the first pins 211*a*, 211*b* are provided on a bottom surface of the first chip 210, and a second pin is provided on a top surface of the second chip 220, and the second chip 220 is provided on the top surface of the first chip 210. As shown in FIG. 2, one side of the first chip 210 facing the substrate 100 is provided with an adhesive film 300, and the adhesive film 300 is adhered to the substrate 100. The top surface of the substrate 100 is provided with a circuit layers 110*a*, 110*b*, or/and the bottom surface of the substrate 100 is provided with circuit layers 110*a*, 110*b*, or/and the circuit layers 110*a*, 110*b* are provided in the substrate 100, the circuit layers 110*a*, 110*b* are provided with circuit pins, and the substrate 100 is provided with a connection through holes 120*a*, 120*b*, the circuit pins is engaged with the connection through holes 120*a*, 120*b*; the bottom surface of the first chip 210 faces the substrate 100, and the first openings of the connection through holes 120*a*, 120*b* are engaged with the first pins 211*a*, 211*b*, An additional through hole is formed on the adhesive film 300, and the conductive layers 400*a* and 400*b* are formed in the connection through holes 120*a* and 120*b* through the second openings of the connection through holes 120*a* and 120*b*. The conductive layers 400*a* and 400*b* penetrate into the additional through holes to electrically connect the first pins 211*a*, 211*b* and the circuit pins; the second pins and the circuit layers 110*a*, 110*b* are electrically connected through the conductive wire leads 500*a*, 500*b*. If necessary, the first pins 211*a*, 211*b* and the circuit layers 110*a*, 110*b* may be electrically connected first, and then the second pins are connected to the circuit layers 110*a*, 110*b*, or the second pins and the circuit layers 110*a*, 110*b* may be electrically connected first, and then the first pins 211*a*, 211*b* are connected to the circuit layers 110*a*, 110*b*. In the above, the substrate 100 is provided thereon with more than one circuit layers 110*a*, 110*b*. The first pins 211*a*, 211*b* are electrically connected to at least one of the circuit layers 110*a*, 110*b*, and the second pins are electrically connected to at least one of the circuit layers 110*a*, 110*b*.

The connection through holes 120*a* and 120*b* are formed in advance on the substrate 100, and after the first chip 210 is placed on the substrate 100, the conductive layers 400*a* and 400*b* are formed. In the above, the first pins 211*a* and 211*b* are engaged with the first openings of the connection through holes 120*a* and 120*b*, and are not necessarily strictly aligned, as long as the first pins 211*a* and 211*b* and the conductive layer 400*a* and 400*b* can be electrically connected through the connection through holes 120*a* and 120*b*.

The conductive bonding material may be fed from the second openings of the connecting through holes 120*a*, 120*b* into the connecting through holes 120*a*, 120*b* during the process of forming the conductive layers 400*a*, 400*b* in the connecting through holes 120*a*, 120*b* through the second openings of the connecting through holes 120*a*, 120*b*, such that the conductive bonding material is adhered to the inner wall of the connecting through holes 120*a*, 120*b* and the device pins to form the conductive layers 400*a*, 400*b*. By the way of feeding the conductive bonding material from the second opening, the operation can be done at the bottom surface of the substrate 100 without being disturbed by the components, and the conductive bonding material is adhered to the connecting through holes 120*a*, 120*b* and the inner walls of the first pins 211*a*, 211*b* by means of bonding. The mechanical and electrical connections are simultaneously formed after heat treatment or chemical treatment to obtain stable conductive connection performance. The conductive bonding material is a solder ball, or a solder paste, or a conductive paste, or a conductive metal slurry, and one or more combinations may be selected according to the needs of the process or the material of the substrate 100 and the properties of the inner walls of the connecting through holes 120a and 120b. The conductive bonding material may also be provided in the connection through holes 120a, 120b by screen printing. Screen printing is a common manufacturing method of the circuit layers 110a and 110b. The conductive layers 400a and 400b are formed by means of the screen printing, which device is universal and can be synchronized with the fabrication of the circuit layers 110a and 110b, which saves the process flow and further reduces the cost. The structure of the conductive layers 400a, 400b finally obtained using a conductive bonding material is referred to FIG. 14.

Alternatively, the conductive layers 400a and 400b may be formed by means of electroplating in the process of forming the conductive layers 400a and 400b in the connection through holes 120a and 120b through the second openings of the connection through holes 120a and 120b. Good electrical conductivity can be obtained, and electroplating can control the thickness of the conductive layers 400a, 400b to obtain desired electrical conductivity. Referring to FIGS. 5, 7, 8, and 10, the structures of the conductive layers 400a, 400b finally obtained using a conductive bonding material are shown.

B. The steps of the post-punch method includes: a first pins 211a, 211b is provided on a bottom surface of the first chip 210, the second pin is provided on a top surface of the second chip 220, and the second chip 220 is provided on the top surface of the first chip 210. The first chip 210 is placed on the substrate 100, the bottom surface of the first chip 210 faces the substrate 100, the top surface of the substrate 100 is provided with circuit layers 110a, 110b, or/and the bottom surface of the substrate 100 is provided with a circuit layers 110a, 110b, or/and the substrate 100 are provided therein with circuit layers 110a, 110b, the circuit layers 110a, 110b are provided with circuit pins; the first pins 211a, 211b are electrically connected to at least one of the circuit layers 110a, 110b, the connection through holes 120a, 120b are formed on the substrate 100, such that the first openings of the connection through holes 120a, 120b are engaged with the first pins 211a, 211b, and the circuit pins are engaged with the connection through holes 120a, 120b. The conductive layers 400a, 400b are formed in the connection through holes 120a, 120b through the second openings of the connection through holes 120a, 120b, such that the conductive layers 400a, 400b electrically connect the first pins 211a, 211b and the circuit pins; the second pins are electrically connected to at least one of the circuit layers 110a, 110b, and the second pins are electrically connected to circuit layers 110a, 110b through the conductive wire leads 500a, 500b. After the first chip 210 is placed on the substrate 100, the connection through holes 120a and 120b are formed on the substrate 100.

In the post-punch method, generally, the circuit layers 110a and 110b are generally fabricated on the substrate 100 in advance, but not limited thereto. The circuit layers 110a, 110b may be fabricated on the substrate 100 when the conductive layers 400a and 400b of connection through holes are fabricated, for example, a release layer is provided on the bottom surface of the substrate 100. The release layer has model slots with similar contour to the circuit layers 110a and 110b. After the connection through holes 120a and 120b are formed, the circuit layers 110a, 110b are formed in the model slots while the conductive layers 400a and 400b are fabricated. Taking the electroplating manufacturing method as an example, while electroplating the conductive layers 400a, 400b, a layer of conductive layer is also electroplated in the model slots and on the surface of the release layer, and then the release layer and the conductive layer on the surface thereof are removed, and the circuit layers 110a, 110b of the substrate surface can be formed. The process of fabricating the conductive layers 400a, 400b by means of electroplating further includes fabricating an auxiliary layer by using a sputtering or vapor deposition process before electroplating, and then electroplating. The sputtered or vapor-deposited auxiliary layer can be better electrically connected to the circuit pins, and the electroplated conductive layers 400a, 400b are attached to the auxiliary layer. Sputtering or vapor deposition of the auxiliary layer, on the one hand, can improve the quality of the electroplating, and on the other hand, can better achieve the electrical connection between the conductive layers 400a, 400b and the circuit pins. In this way, one process simultaneously accomplishes two tasks, improving production efficiency and reducing cost.

The connection through holes 120a and 120b may be formed in advance on the substrate 100 as needed, or the connection through holes 120a and 120b may be formed on the substrate 100 after the first chip 210 is placed. The first chip 210 and the second chip 220 may be fixed to each other, and then the chipset is placed on the substrate 100, and the first chip 210 is electrically connected to the circuit layers 110a and 110b. Alternatively, the first chip 210 may be placed on the substrate 100 and then, the second chip 220 is placed on the top surface of the first chip 210.

Embodiment 2

Figure 8:
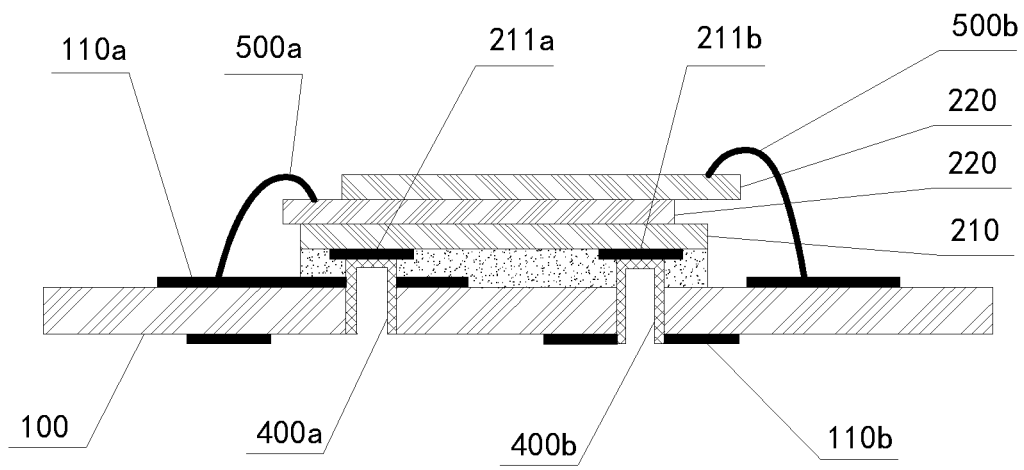
FIG. 8 is a schematic diagram 1 of an integrated circuit multichip stacked package method according to embodiment 2 of the present disclosure.

The difference between the embodiment 2 and the embodiment 1 is as follows:

As shown in FIG. 8, the second chip 220 is at least two (only two are shown in the figure), and at least two second chips 220 are in stacked arrangement, and in the adjacent two second chips 220, the second chip 220 at the top layer is mounted on the top surface of the second chip 220 at the bottom layer, and the second chip 220 at the top layer is offset from the second pin on the second chip 220 at the bottom layer. The top surface of the first chip 210 may be provided with at least two second chips 220 to achieve more electronic functions.

As shown in FIG. 9, the top surface of the topmost second chip 220 is provided with a heat sink 700. When the chip is stacked, a large amount of heat is generated during the working process, and the heat sink 700 is provided to help dissipate the heat of the chip to prevent the high temperature from affecting the working performance of the chip.

An encapsulation layer 800 is further provided. The first chip 210, the second chip 220, the conductive wire leads 500a, 500b, and the heat sink 700 are located between the encapsulation layer 800 and the substrate 100. The encapsulation layer 800 packages the first chip 210, the second chip 220, the conductive wire leads 500a, 500b and the heat sink 700 on the top surface of the substrate 100.

Embodiment 3

Figure 10:
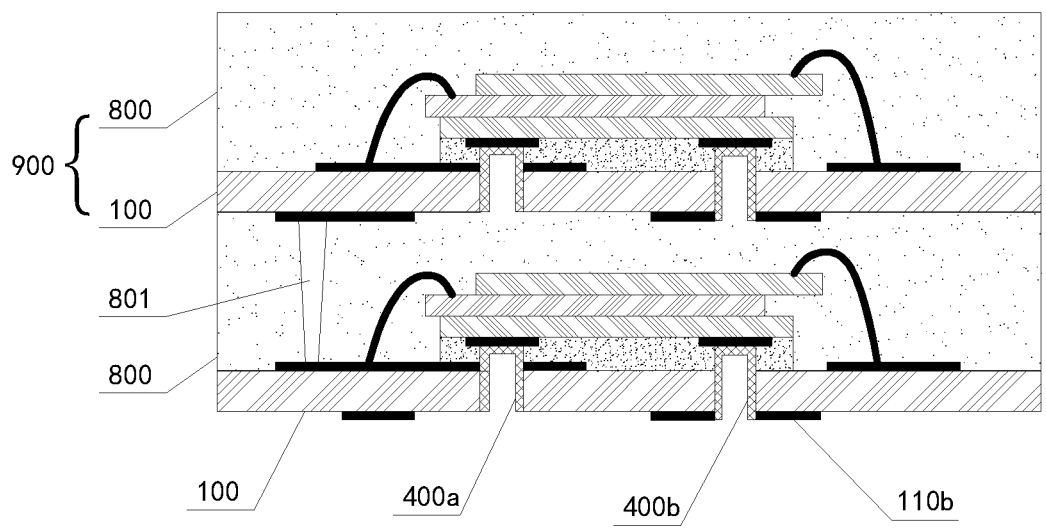
FIG. 10 is a schematic diagram of an integrated circuit multichip stacked package method according to embodiment 3 of the present disclosure.

The difference between the embodiment 3 and the embodiment 1 is as follows:

As shown in FIG. 10, the substrate 100, the encapsulation layer 800, the first chip 210, and the second chip 220 constitute a package subsystem 900. The two package subsystems 900 are in stacked arrangement, and the substrate 100 of the package subsystem 900 at the top layer is provided on the top surface of the encapsulation layer 800 of the package subsystem 900 at the bottom layer, the encapsulation layer 800 of the package subsystem 900 at the bottom layer is provided with via hole 801, conductors are provided in the via hole 801, and conductors within the via hole 801 electrically connect the circuit layers 110a, 110b of the package subsystem 900 at the top layer and the circuit layers 110a, 110b of the package subsystem 900 at the bottom layer. The circuit functions are expanded by laminating and interconnecting more than two layers of package subsystems 900. In the package subsystem 900, the first chip 210 is connected to the circuit layers 110a, 110b of the substrate 100 by using the connection through holes 120a, 120b, so that the package subsystem 900 itself has a small thickness and a small volume. Under the same volume and thickness requirements, more layers of the package subsystem 900 can be provided, which greatly expands the circuit functions.

Embodiment 4

The substrate 100 is provided with at least two layers of circuit layers 110a, 110b, the top surface of the substrate 100 is provided with circuit layers 110a, 110b, or/and the bottom surface of the substrate 100 is provided with circuit layers 110a, 110b, or/and the circuit layers 110a, 110b is provided in the substrate 100. There are at least two first pins 211a, 211b, one of the first pins 211a, 211b is electrically connected to at least one of the circuit layers 110a, 110b, and the other one of first pins 211a, 211b is electrically connected at least to the other one of the remaining circuit layers 110a, 110b. The first chip 210 is simultaneously connected to more than two layers of the circuit layers 110a, 110b, the communication port is increased, the transmission capability is enhanced, and the circuit functions are expanded.

Embodiment 5

Figure 11:
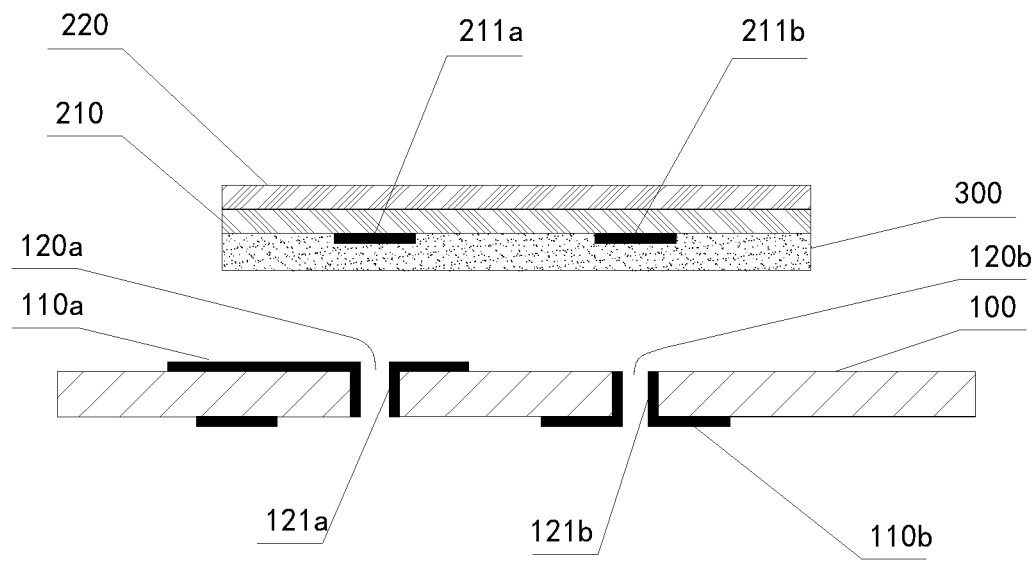
FIG. 11 is a schematic diagram 1 of an integrated circuit multichip stacked package method according to embodiment 5 of the present disclosure.
Figure 12:
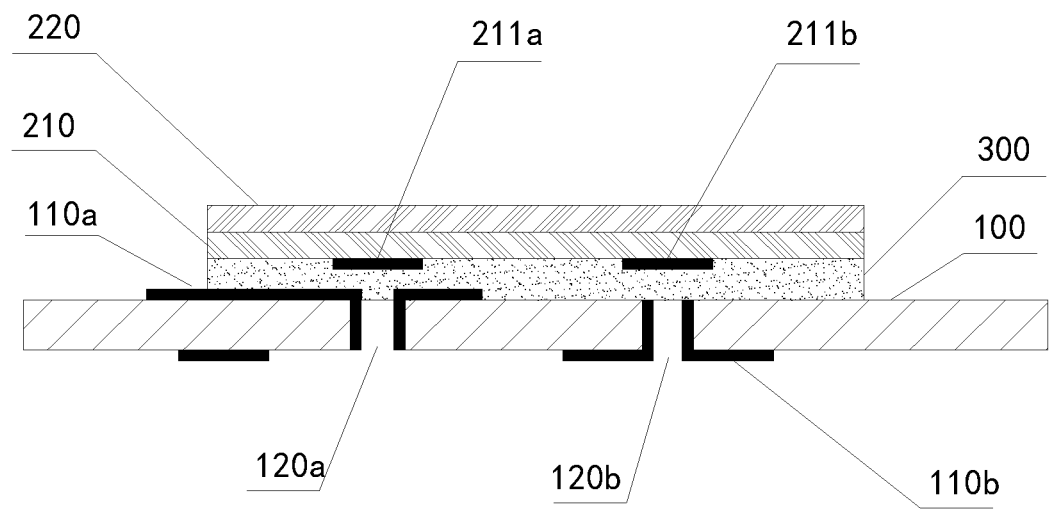
FIG. 12 is a schematic diagram 2 of an integrated circuit multichip stacked package method according to embodiment 5 of the present disclosure.
Figure 13:
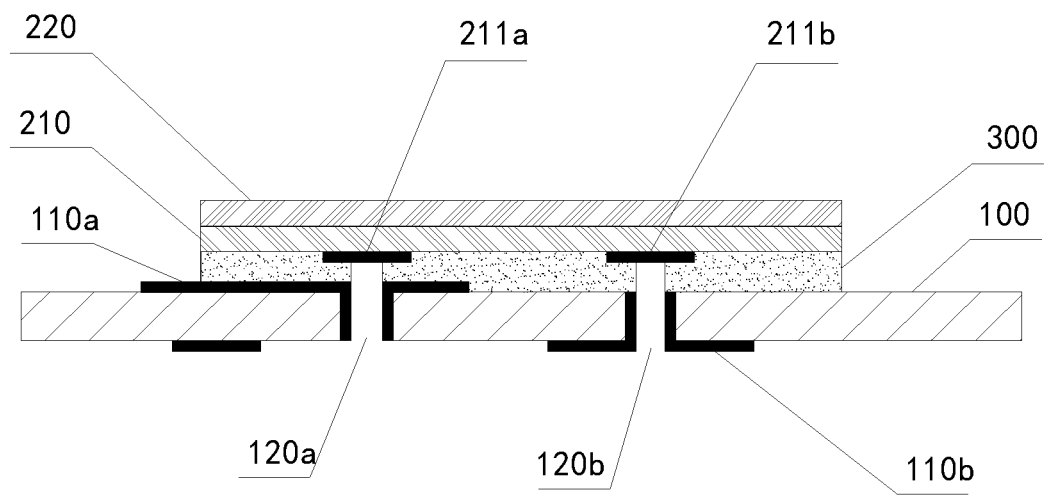
FIG. 13 is a schematic diagram 3 of an integrated circuit multichip stacked package method according to embodiment 5 of the present disclosure.
Figure 14:
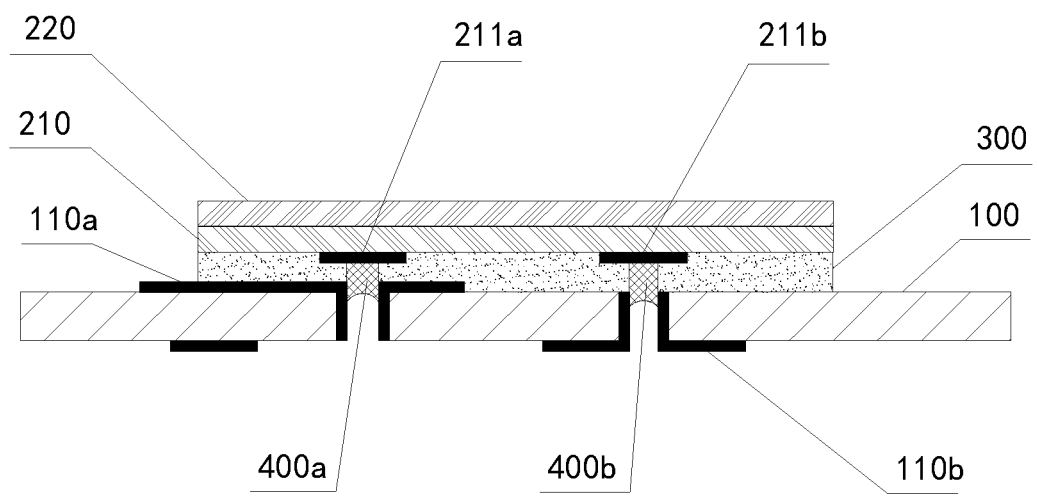
FIG. 14 is a schematic diagram 4 of an integrated circuit multichip stacked package method according to embodiment 5 of the present disclosure.

The difference between the embodiment 5 and the embodiment 1 is as follows:

As shown in FIGS. 11 to 14, a protective layer is provided on the inner walls of the connecting through holes 120a, 120b, the protective layer is used for protecting the substrate 100 when the additional through holes are formed. The additional through holes may be formed by using, but not limited to, a chemical etching or a drilling process. In this case, it is necessary to pass through the connection through holes 120a, 120b, which may damage the inner walls of the connection through holes 120a, 120b, and thus may damage the substrate 100 and the circuit layers 110a, 110b, and the protective layer can protect the inner walls of the connecting through holes 120a, 120b from being damaged. Further, the protective layer may be a material that facilitates electrical connection of the conductive layers 400a, 400b, in which case the protective layer may be in contact with the circuit pins to facilitate electrical connection of the circuit pins and the conductive layers 400a, 400b. The packaging steps are as shown in FIGS. 10 to 13. First, as shown in FIGS. 11 and 12, the adhesive film 300 bonds the first chip 210 to the substrate 100; and as shown in FIG. 13, an additional through hole is formed on the adhesive film 300; and as shown in FIG. 14, conductive layers 400a, 400b are fabricated in the connection through holes 120a, 120b.

The inner walls of the connection through holes 120a, 120b are provided with protective layers, which are also the auxiliary layers 121a, 121b, and the protective layers (the auxiliary layers 121a, 121b) are not shown in the figure, with reference to FIGS. 10 to 13. Moreover, in the present embodiment, the protective layers (the auxiliary layers 121a and 121b) are made of the same material as the circuit layers 110a and 110b. For example, the circuit layers 110a and 110b are made of copper, and the protective layers (the auxiliary layers 121a and 121b) are also made of copper, which further enhances electrical connection performance. However, it is not limited to the present embodiment, and other materials may be used as needed, and the protective layers providing the protection or the auxiliary layers 121a and 121b for the auxiliary electrical connection may be separately provided. In the above, the protective layers (auxiliary layers 121a, 121b) are electrically connected to the circuit layers 110a, 110b, and the conductive layers 400a, 400b electrically connect the device pins and the circuit pins. The protective layer (the auxiliary layer 121a, 121b) is directly electrically connected to the circuit pins, which has good electrical connection effect, and can extend the circuit pins, reduce the volume of the conductive layers 400a, 400b, which facilitates the fabrication of the conductive layers 400a, 400b, and also facilitates to reduce cost.

In this embodiment, alternatively, the conductive layers 400a and 400b may be fabricated by means of electroplating, and the auxiliary layers 121a and 121b may be fabricated by using a sputtering or vapor deposition process before electroplating. The sputtered or vapor-deposited auxiliary layers 121a, 121b can be better electrically connected to the circuit pins, and the electroplated conductive layers 400a, 400b are attached to the auxiliary layers 121a, 121b, which can be better electroplated, on the one hand, and on the other hand, the electrical connection of the conductive layers 400a, 400b and the circuit pins can be better achieved through the auxiliary layers 121a, 121b. Moreover, sputtering, vapor deposition, and electroplating can be simultaneously performed for all components on the substrate 100 to improve efficiency.

In the present embodiment, the circuit layers 110a and 110b are fabricated on the substrate 100 in advance, but not limited thereto, the circuit layers 110a and 110b also may be fabricated on the substrate 100 during the integrated circuit package. For example, the release layer is provided on the bottom layer of the substrate 100, the release layer has a model slots with similar contour to the circuit layers 110a, 110b, and after the connection through holes 120a, 120b are formed, the circuit layers 110a, 110b are formed in the model slots while the conductive layers 400a, 400b are fabricated, for example, the conductive layers 400a, 400b are fabricated by means of electroplating, and a layer of conductive material is also electroplated in the model slots and on the surface of the release layer at the time of electroplating, and then the release layer and the conductive material on the surface thereof are removed, thereby forming the circuit layers 110a, 110b on the substrate surface.

The "top" and "bottom" orientations in the above embodiments are referred to the orientations shown in the drawings, but only for the sake of clarity and conciseness of description, and the orientation created by the present disclosure cannot be limited thereto. The integrated circuit multichip stacked package structure can be rotated to any angle.

Each of the technical features of the above embodiments may be arbitrarily combined. For the sake of brevity of description, all possible combinations of each of the technical features in the above embodiments are not described. However, as long as there is no contradiction in the combination of these technical features, it should be considered to be the range described in the present specification.

The above embodiments are merely illustrative of several embodiments of the present disclosure, and the description thereof is relatively specific and detailed, but is not to be construed as limiting the scope of the present disclosure. It should be noted that a number of variations and improvements may be made by those ordinarily skilled in the art without departing from the conception of the present disclosure, which all fall within the protection scope of the present disclosure. Therefore, the protection scope of the present disclosure should be determined by the appended claims.

The invention claimed is:

1. An integrated circuit multichip stacked package structure, comprising:
   a first chip, wherein a bottom surface of the first chip is provided with first pin(s);
   a second chip, wherein a top surface of the second chip is provided with second pin(s); and a substrate, wherein a top surface of the substrate is provided with circuit layers, or the top surface and an interior of the substrate are provided with circuit layers, or the top surface, the interior and a bottom surface of the substrate are provided with circuit layers,
   wherein the first chip is provided on the top surface of the substrate, and the second chip is provided on a top surface of the first chip;
   the first pin(s) is electrically connected to at least one of the circuit layers; the circuit layers are provided with circuit pins; the substrate is provided with a connection through hole; the connection through hole is engaged with the circuit pin; a first opening of the connection through hole is engaged with the first pin(s); a second opening of the connection through hole is an operation window; a conductive layer is provided in the connecting through hole; and the conductive layer electrically connects the first pin and the circuit pin; and
   the second pin(s) is electrically connected to at least one of the circuit layers; and the second pin(s) and the circuit layer are electrically connected by a conductive wire lead.

2. The integrated circuit multichip stacked package structure according to claim 1, wherein the second chips are in number of at least two, at least two second chips are in stacked arrangement; and in two adjacent second chips, the second chip at a top layer is mounted on a top surface of the second chip at a bottom layer, and the second chip at the top layer is offset from the second pin on the second chip at the bottom layer.

3. The integrated circuit multichip stacked package structure according to claim 2, wherein a heat sink is provided on the top surface of the second chip at a topmost layer.

4. The integrated circuit multichip stacked package structure according to claim 1, wherein an adhesive film is provided between the first chip and the substrate; the adhesive film bonds the first chip to the substrate; the adhesive film is provided with an additional through hole; the additional through hole is connected with the first opening of the connection through hole; and the conductive layer extends into the additional through hole and is electrically connected to the first pin(s).

5. The integrated circuit multichip stacked package structure according to claim 1, further comprising an encapsulation layer, wherein the first chip and the second chip are located between the encapsulation layer and the substrate; and the encapsulation layer packages the first chip and the second chip on the top surface of the substrate.

6. The integrated circuit multichip stacked package structure according to claim 1, wherein the top surface of the substrate is further provided with a reinforcing strip; and the reinforcing strip surrounds or partially surrounds a periphery of a chip.

7. The integrated circuit multichip stacked package structure according to claim 6, wherein the top surface of the substrate is further provided with an encapsulation layer; the encapsulation layer comprises a filling layer and an outer casing layer; the filling layer, the reinforcing strip, the first chip, and the second chip are located between the outer casing layer and the substrate; one end of the reinforcing strip abuts against the substrate; and the other end abuts against the outer casing layer, and the filling layer is filled between the outer casing layer and the substrate.

8. The integrated circuit multichip stacked package structure according to claim 1, wherein the substrate comprises at least two substrate sheets; at least two substrate sheets are in stacked arrangement, the substrate sheet is provided with the circuit layer, at least one of the substrate sheets is provided with a through hole; and a conductive material passes through the through hole to electrically connect at least two circuit layers.

9. The integrated circuit multichip stacked package structure according to claim 1, wherein the substrate, a encapsulation layer, the first chip and the second chip constitute a package subsystem; two package subsystems are in stacked arrangement; the substrate of the package subsystem located at a top layer is provided on a top surface of the encapsulation layer of the package subsystem located at a bottom layer; the encapsulation layer of the package subsystem located at the bottom layer is provided with a via hole; a conductor is provided in the via hole; and the conductor within the via hole electrically connects a circuit layer of the package subsystem located at the top layer and a circuit layer of the package subsystem located at the bottom layer.

10. The integrated circuit multichip stacked package structure according to claim 1, wherein the substrate is provided with at least two layers of the circuit layer; the top surface of the substrate is provided with the circuit layer; or/and the bottom surface of the substrate is provided with the circuit layer; or/and the circuit layer is provided in the substrate; the first pins is in number of at least two; one of the first pins is electrically connected to at least one of the circuit layers; and the other one of the first pins is electrically connected at least to the other one of remaining circuit layers.

11. The integrated circuit multichip stacked package structure according to claim 1, wherein the substrate is a flexible circuit board, or the substrate comprises at least two layers of flexible circuit boards, which are in stacked arrangement.

12. An integrated circuit multichip stacked package method, comprising:
    making a first chip provided with first pin(s) on a bottom surface thereof and a second chip provided with second pin(s) on a top surface thereof, wherein the second chip is provided on a top surface of the first chip, making a top surface of a substrate provided with circuit layers, or making the top surface and an interior of the substrate provided with circuit layers, or making the top surface, the interior and a bottom surface of the substrate provided with circuit layers, wherein the circuit layers are provided with circuit pin; the substrate is provided with a connection through hole; and the circuit pin is engaged with the connection through hole;

making the first pin(s) electrically connected to at least one of the circuit layers and placing the first chip on the substrate, wherein a bottom surface of the first chip faces the substrate, such that a first opening of the connection through hole is engaged with the first pin(s), a conductive layer is formed in the connection through hole through a second opening of the connection through hole, and the conductive layer electrically connects the first pin and the circuit pin; and making the second pin electrically connected to at least one of the circuit layers, and electrically connecting the second pin to the circuit layer through a conductive wire lead.

13. An integrated circuit multichip stacked package method, comprising:

making a first chip provided with first pin(s) on a bottom surface thereof, and a second chip provided with second pin(s) on a top surface thereof, wherein the second chip is provided on a top surface of the first chip;

placing the first chip on a substrate, wherein a bottom surface of the first chip faces the substrate, a top surface of the substrate is provided with circuit layers, or the top surface and an interior of the substrate are provided with circuit layers, or the top surface, the interior and a bottom surface of the substrate are provided with circuit layers, and the circuit layers are provided with a circuit pin;

making the first pin(s) is electrically connected to at least one of the circuit layers, wherein a connection through hole is formed on the substrate, such that a first opening of the connection through hole is engaged with the first pin(s), and the circuit pin is engaged with the connection through hole, a conductive layer is formed in the connection through hole through a second opening of the connection through hole, such that the conductive layer electrically connects the first pin and the circuit pin; and making the second pin(s) electrically connected to at least one of the circuit layers, and making the second pin(s) is electrically connected to the circuit layer by a conductive wire lead.

14. The integrated circuit multichip stacked package structure according to claim 2, wherein the substrate, a encapsulation layer, the first chip and the second chip constitute a package subsystem; two package subsystems are in stacked arrangement; the substrate of the package subsystem located at a top layer is provided on a top surface of the encapsulation layer of the package subsystem located at a bottom layer; the encapsulation layer of the package subsystem located at the bottom layer is provided with a via hole; a conductor is provided in the via hole; and the conductor within the via hole electrically connects a circuit layer of the package subsystem located at the top layer and a circuit layer of the package subsystem located at the bottom layer.

15. The integrated circuit multichip stacked package structure according to claim 3, wherein the substrate, a encapsulation layer, the first chip and the second chip constitute a package subsystem; two package subsystems are in stacked arrangement; the substrate of the package subsystem located at a top layer is provided on a top surface of the encapsulation layer of the package subsystem located at a bottom layer; the encapsulation layer of the package subsystem located at the bottom layer is provided with a via hole; a conductor is provided in the via hole; and the conductor within the via hole electrically connects a circuit layer of the package subsystem located at the top layer and a circuit layer of the package subsystem located at the bottom layer.

16. The integrated circuit multichip stacked package structure according to claim 4, wherein the substrate, a encapsulation layer, the first chip and the second chip constitute a package subsystem; two package subsystems are in stacked arrangement; the substrate of the package subsystem located at a top layer is provided on a top surface of the encapsulation layer of the package subsystem located at a bottom layer; the encapsulation layer of the package subsystem located at the bottom layer is provided with a via hole; a conductor is provided in the via hole; and the conductor within the via hole electrically connects a circuit layer of the package subsystem located at the top layer and a circuit layer of the package subsystem located at the bottom layer.

17. The integrated circuit multichip stacked package structure according to claim 2, wherein the substrate is provided with at least two layers of the circuit layer; the top surface of the substrate is provided with the circuit layer; or/and the bottom surface of the substrate is provided with the circuit layer; or/and the circuit layer is provided in the substrate; the first pins is in number of at least two; one of the first pins is electrically connected to at least one of the circuit layers; and the other one of the first pins is electrically connected at least to the other one of remaining circuit layers.

18. The integrated circuit multichip stacked package structure according to claim 3, wherein the substrate is provided with at least two layers of the circuit layer; the top surface of the substrate is provided with the circuit layer; or/and the bottom surface of the substrate is provided with the circuit layer; or/and the circuit layer is provided in the substrate; the first pins is in number of at least two; one of the first pins is electrically connected to at least one of the circuit layers; and the other one of the first pins is electrically connected at least to the other one of remaining circuit layers.

19. The integrated circuit multichip stacked package structure according to claim 4, wherein the substrate is provided with at least two layers of the circuit layer; the top surface of the substrate is provided with the circuit layer; or/and the bottom surface of the substrate is provided with the circuit layer; or/and the circuit layer is provided in the substrate; the first pins is in number of at least two; one of the first pins is electrically connected to at least one of the circuit layers; and the other one of the first pins is electrically connected at least to the other one of remaining circuit layers.

20. The integrated circuit multichip stacked package structure according to claim 2, wherein the substrate is a flexible circuit board, or the substrate comprises at least two layers of flexible circuit boards, which are in stacked arrangement.

* * * * *